United States Patent [19]
de Vries et al.

[11] Patent Number: 5,124,624
[45] Date of Patent: Jun. 23, 1992

[54] ARRANGEMENT FOR ELECTRICAL MEASUREMENT

[75] Inventors: Jacob de Vries, Allenwinden; Heinz Lienhard, Zug, both of Switzerland

[73] Assignee: Landis & Gyr Betriebs AG, Zug, Switzerland

[21] Appl. No.: 618,478

[22] Filed: Nov. 27, 1990

[30] Foreign Application Priority Data

Dec. 14, 1989 [CH] Switzerland .................. 4497/89

[51] Int. Cl.$^5$ .............................. G01R 19/00
[52] U.S. Cl. ............................ 324/142; 324/74; 324/110
[58] Field of Search ............... 324/110, 74, 113, 142; 340/637, 653; 364/483

[56] References Cited

U.S. PATENT DOCUMENTS

| | | | |
|---|---|---|---|
| 4,056,774 | 11/1977 | Shum | 324/142 |
| 4,079,313 | 3/1978 | Callan | 324/142 |
| 4,217,634 | 8/1980 | Dalley | 324/119 |
| 4,420,721 | 12/1983 | Dorey | 324/110 |
| 4,434,400 | 2/1984 | Halder | 324/110 |
| 4,528,458 | 7/1985 | Nelson | 340/653 |
| 4,615,009 | 9/1986 | Battodetti et al. | 324/142 |
| 4,766,370 | 8/1988 | Carr | 340/637 |
| 4,931,725 | 6/1990 | Hutt | 324/142 |
| 4,937,520 | 6/1990 | Arseneau et al. | 324/74 |

FOREIGN PATENT DOCUMENTS 0163440 12/1985 European Pat. Off. .
3126485 1/1983 Fed. Rep. of Germany .
3743064 3/1989 Fed. Rep. of Germany .

OTHER PUBLICATIONS

Abstract of JP-A-57 63 461 Apr. 16, 1982, by Ikeda.

Primary Examiner—Kenneth A. Wieder
Assistant Examiner—William J. Burns
Attorney, Agent, or Firm—Marmorek, Guttman & Rubenstein

[57] ABSTRACT

An arrangement for electrical measurement ascertains "subordinate" quantities, and is also "main" quantities with great accuracy and safety against falsification. An active energy to be measured is a main quantity, and a subordinate quantity is at least one of the following quantities: effective value of the voltage ($u_N$) or of the current ($i_N$), volt hours, volt square hours, ampere hours, ampere square hours, active power, reactive power, reactive energy, apparent output, apparent energy or power factor. The arrangement may comprise a voltage sensor (8), a voltage/current-converter (9), a multiplier (10), a current/voltage-converter (11), two analog/digital-converts (12 and 15), a signal/frequency-converter (13), a counter (14), an interface circuit (4), and an indicator (7), wherein the current/voltage-converter (11) consists of a constant current source (16) and a further multiplier (17).

22 Claims, 4 Drawing Sheets

ARRANGEMENT FOR ELECTRICAL MEASUREMENT

FIELD OF THE INVENTION

This invention relates to an arrangement for determining electrical quantity values from the measured values of at least two electric input quantities.

DESCRIPTION OF THE PRIOR ART

Electric quantities which may need to be determined may be characteristic quantities of an electric supply apparatus, such as the values of volt-hours, volt-square hours, ampere-hours, ampere-square hours, active powers, active energies, power factors or the effective values of voltages or currents, which are all derivable from the measured values of an electric voltage and an associated electric current. In France, for example, the so-called "Tarif-bleu" electricity meter is used which, in addition to the consumption of used energy, ascertaining the effective values of load currents.

At least one electric voltage and the associated electric current may be the two quantities input to the arrangement, and for example the voltage may be a supply voltage of a one phase energy supply network or a phase voltage of a three phase energy supply network, and the current may be an associated load current.

Arrangements of the kind mentioned above are used to advantage in multi-function meters. An arrangement of this kind is disclosed in German patent application DE 31 26 485 A1 which describes a three phase measuring arrangement for measuring voltages, currents, active powers, reactive powers, apparent outputs and power factors. Instantaneous values of voltages and of associated currents are periodically detected by means of sample/hold circuits and analog/digital-converters. The quantites to be determined are then calculated in a central unit.

If at least one of the ascertained electric quantities, such as active energy, is used to ascertain the costs of energy consumption, then such an electric quantity, hereinafter termed a main quantity, is preferably ascertained by the arrangement with great accuracy and most importantly with great security against falsification and fraud. Some other electric quantities, which will be termed subordinate quantities, are of secondary importance, and the accuracy and security against falsification and fraud of these quantities is of less importance because greater errors can be permitted for these quantities and a falsification per se is not as crucial because the portion of the cost attributable to these subsidiary quantities is substantially less.

Arrangements with sample/hold circuits are, in this respect, not safe from fraud, because, for example, energy can be intermittently consumed with relative ease in the gaps between sample pulses, and can be synchronised therewith so that when there are sample pulses no energy is consumed, and the energy consumption would always be given a value of zero by the sample pulses.

SUMMARY OF THE INVENTION

In accordance with the present invention, there is provided an arrangement for determining electrical quantity values from measured values of at least two input electrical quantities, wherein the electric quantities to be determined are classified as at least one main quantity and at least one subordinate quantity, and comprising means for determining the or each subordinate quantity, and means for determining the or each main quantity with an accuracy and/or security against falsification which is significantly greater than that provided by the subordinate quantity determining means.

The invention therefore provides an arrangement in which a number of different kinds of electric quantities can be determined, and in which, contrary to some quantities, particularly important electric quantities are classified as main quantities and are determined with great accuracy and with a high degree of security from fraud.

DETAILED DESCRIPTION OF THE PREFERRED EMBODIMENTS

The electric quantities to be calculated are classified as at least one main quantity and at least one subordinate quantity. When a main quantity is to be ascertained, as already mentioned, the required accuracy and security against fraud is significantly greater than when a subordinate quantity is to be calculated. In the preferred embodiments, at least the active energy to be measured is classified as a main quantity. In this case, at least one of the following quantities may be classified as a subordinate quantity: effective value of a voltage or of a current, volt-hours, volt-square-hours, ampere-hours, ampere-square-hours, active power, reactive power, reactive energy, apparent output, apparent energy and power factor.

At least one of the main quantities, preferably the active energy which is to be measured, can simultaneously also be a subordinate quantity, the calculation of which then serves, for example, to monitor the accuracy of the calculated values of the main quantity. Thus, for example, the value of an active energy to be measured is preferably determined twice, once very accurately and free from falsification for the purpose of determining an associated cost, and once rather roughly for the purpose of carrying out a rough check, for security reasons, to see that the arrangement is functioning correctly.

For reasons of simplicity, the drawings show only one single main quantity, namely an active energy which is to be measured, which is to be determined by the arrangement.

Figure 1:
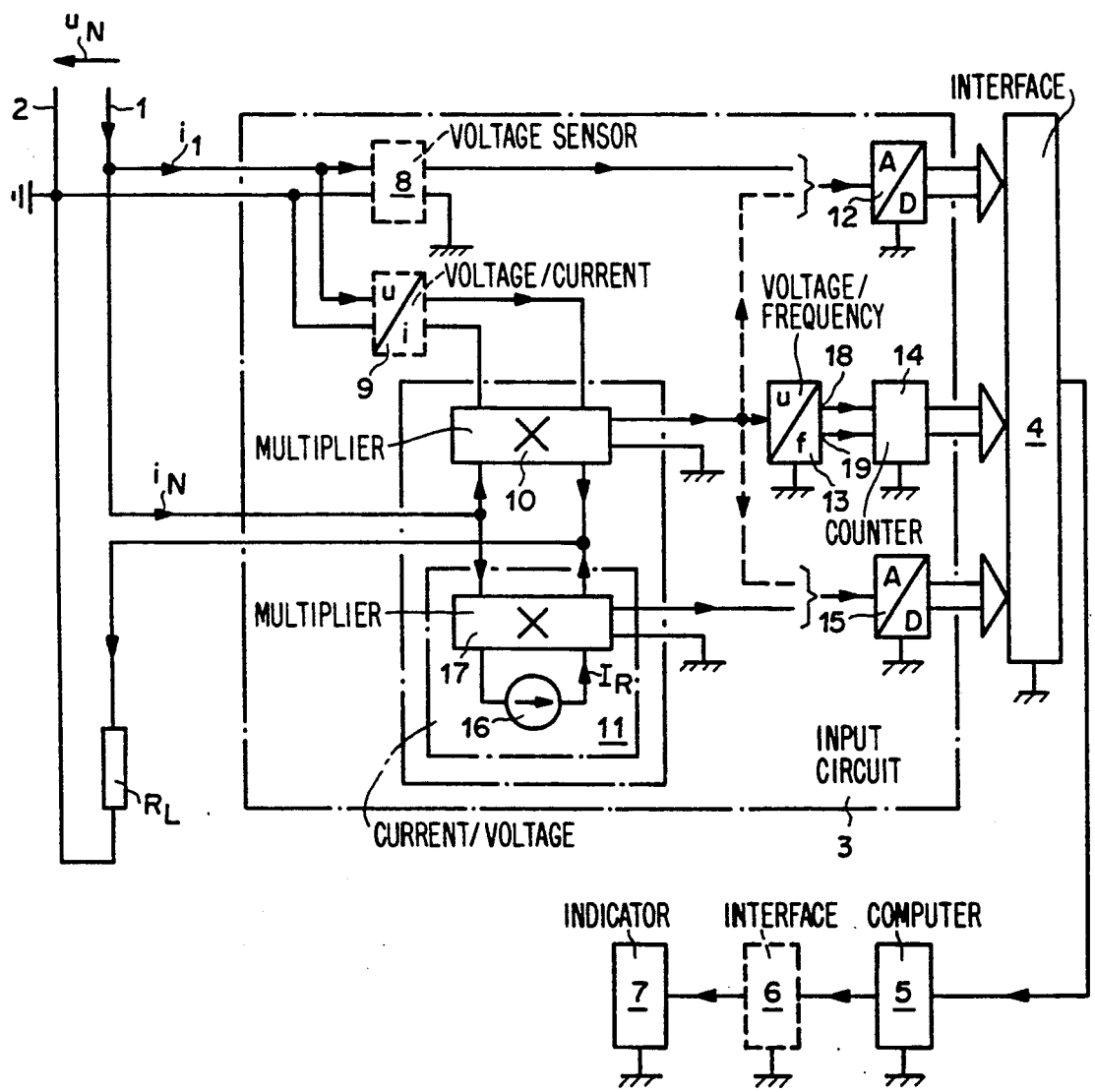
FIG. 1 shows a block circuit diagram of a first variant of a one-phase arrangement.

In the first variant of a one phase arrangement shown in FIG. 1, a supply voltage $u_N$ and an associated load current $i_N$ in a one phase energy supply network are supplied to the arrangement as input quantities by two conductors 1 and 2, wherein the conductor 2 is generally a neutral conductor and is, for example, earthed. A consuming device attached to the energy supply network is shown in the form of load resistor $R_L$.

The arrangement consists of an input circuit 3, an interface circuit 4, a computer 5, an optical further interface circuit 6 and an indicator 7, which are connected in cascade in the sequence shown.

The computer 5 is a digital arithmetic unit, preferably a microcomputer, and it serves to determine and store the values of main and subordinate quantities. The indicator 7 is either a mechanical indicator in which case the other interface circuit 6 is provided, which is generally a stepping motor, or is an electric indicator, such as a 7 segment-indicator, for example, or a liquid crystal indicator. If the indicator is electric, the other interface circuit 6 may be superfluous in which case it can then be abandoned.

The input circuit 3 preferably contains an optional voltage sensor 8, an optional voltage/current-converter 9, a multiplier 10, a current/voltage-converter 11, a first analog/digital-converter 12, a signal/frequency-converter 13, a counter 14 and a second analog/digital-converter 15. The current/voltage-converter 11 preferably consists of a constant current source 16 and a further multiplier 17. The voltage sensor 8 is e.g. a voltage divider or a voltage converter. The counter 14 is an up/down counter which has two inputs, a first one of which is for an ascending count, and the second one of which is for a descending count. The signal/frequency-converter 13 is, for example, a voltage/frequency-converter and has two outputs 18 and 19, which are connected to respective inputs of the counter 14. All inputs of the voltage sensor 8, of the voltage/current-converter 9, of the multiplier 10, of the current/voltage-converter 11 and of the other multiplier 17 and a first and second input of the arrangement and of the input circuit 3 are bipolar.

The voltage $u_N$ feeds the first input of the input circuit 3 and also feeds the second input of the input circuit 3 by way of load resistor $R_L$, wherein the first and second input are simultaneously the first and second inputs of the arrangement. The first input of the input circuit 3 is fed therewith into a respective high impedance input of the voltage sensor 8 and of the voltage/current-converter 9. If, on the other hand, there is no voltage/current-converter 9, the first input of the input circuit 3 is fed to a first input of the multiplier 10 which is then high impedance, instead of to the voltage/current-converter 9. The voltage $u_N$ thus always supplies the first input of the multiplier 10 either indirectly by way of the voltage/current-converter 9 or directly, an the input of the first analog/digital-converter 12 either indirectly by way of the voltage sensor 8 or directly. The first input of the input circuit 3 is of high resistance, so that a current $i_1$ which flows therein can be neglected because it is very small. The whole of the current $i_N$ thus supplies the second input of the input circuit 3 which is supplied therewith in to an input of the current/voltage-converter 11 and onto a second input of the multiplier 10.

Within the current/voltage-converter 11 the input thereof is supplied to a first input of the other multiplier 17, whereas the constant current source 16 supplies a second input of the latter with a constant reference current $I_R$. The output of the other multiplier 17 forms a bipolar output of the current/voltage-converter 11. One pole of each bipolar output of the voltage sensor 8, of the multiplier 10 and of the current/voltage-converter 11 is earthed, which is also the reference potential of the two analog/digital converters 12 and 15, of the signal/frequency-converter 13, of the counter 14, of the interface circuit 4, of the computer 5, of the other interface circuit 6 and of the indicator 7. The non-earthed output pole of the voltage sensor 8 is supplied by way of the first analog/digital-converter 12 to a first output of the input circuit 3, which in turn is connected to a first input of the interface circuit 4 by way of a bus connector. The non-earthed output pole of the multiplier 10 is connected to the input of the signal/frequency-converter 13, both outputs 18 and 19 of which are supplied by way of the counter 14 to a second output of the input circuit 3, which, in turn is connected to a second input of the interface circuit 4 by way of a second bus connector. The non-earthed output pole of the current/voltage-converter 11 is supplied to a third output of the input circuit 3, by way of the second analog/digital-converter 15, and the third output is connected to a third input of the interface circuit 4 by way of a third bus connector.

The voltage $u_N$ is supplied to the multiplier 10 either directly of after is has been converted into a proportional current by the voltage/current-converter 9. In the multiplier it is multiplied by the current $i_N$, so that the output signal of the multiplier 10 is proportional to the product $u_N \cdot i_N$, i.e. proportional to the active power. This analog output signal is then converted in the signal/frequency-converter 13, with great accuracy, into a proportional analog frequency f with rectangular impulses, which is counted in the counter 14 disposed downstream. When the value of the output is positive, the rectangular impulses reach the counter 14 by way of the output 18 of the signal/frequency-converter 13, and they are counted upwards. When the value of the power is negative, the rectangular impulses reach the counter 14 by way of the output 19 of the signal/frequency-converter 13 and are counted down. The active energy is represented by a digital count value in the counter 14 which has been ascertained by the algebraic addition of the number of impulses, and by way of the second bus connector and the interface circuit 4 it reaches the computer 5, in which it is stored and possibly undergoes further processing, e.g. for the purpose of calculating costs. The digital values of the main quantity active energy which are calculated in this way are very accurate, and are above all safeguard against fraud, because the multiplier 10, the signal/frequency-counter 13 and the counter 14 do not contain any sample/hold circuits.

If there is a voltage sensor 8, it attenuates the values of the supply voltage $u_N$ to a value which can be processed by the first analog/digital-converter 12. This converter converts the analog value of the supply voltage $u_N$ into a corresponding digital value, which is conveyed to the computer 5 by way of the first bus connector and the interface circuit 4.

The other multiplier 17 forms the product $I_R \cdot i_N$, wherein the value of $I_R$ is constant so that the output signal of the other multiplier 17 and thus the output voltage of the current/voltage-converter 11 is proportional to the current $i_N$. The second analog/digital-converter 15 converts the analog output voltage of the current/voltage-converter 11 which is proportional to the current $i_N$ into a corresponding digital value which is supplied to the computer 5 by way of the third bus connector and the interface circuit 4.

Instead of the constant reference current $I_R$, the second input of the multiplier 17 can also be supplied with a current which has been derived from the voltage $u_N$ and which is 90° out of phase therefrom. In this case, the output signal of the multiplier 17 corresponds to the reactive output. For the purpose of further processing, another signal/frequency-converter, not shown, or the analog/digital-converter 15, can be used.

The values of the sampling frequencies of the sample/hold circuits contained in the two analog/digital-converters 12 and 15 can be selected so that they are small, with the result that only subordinate quantities are ascertained using the analog-digital-converters 12 and 15.

Digital values are therefore stored in the computer 5, which are proportional to the voltage $u_N$ and proportional to the current $i_N$, and which are used in the computer 5 for calculating any desired subordinate values which are derivable from the voltage $u_N$ and the current $i_N$. Since both analog/digital-converters 12 and 15 each contain a sample/hold circuit, the calculated values of the subordinate quantities, as already explained in more detail, are not as well safeguard against falsification. However, they represent secondary quantities which are not worth manipulating so much, and which supply only supplementary information to the main quantity. Thus, for example, the active energy can also, on the basis of the values of the voltage $u_N$ and of the current $i_N$, be calculated again in the computer 5 in the form of subordinate quantities, and they can be compared with the main quantity active energy for checking purposes. The object of calculating two different values for the active energy is to detect errors in the arrangement, of instances of falsification.

A similar result is, however, also obtained, and this is shown in FIG. 1 by broken lines, if, instead of the output of the voltage sensor 8 or of the current/voltage-converter 11, the output of the multiplier 10 is supplied to the respective analog/digital-converter 12 or 15. An arrangement which is modified in this way is, however, less universal because in this case the value of either the voltage $u_N$ or the current $i_N$ would not be supplied to the computer 5. In order to overcome this problem, it would be necessary to have a third analog/digital-converter, a fourth output of the input circuit 3 and a fourth input of the interface circuit 4. Either way, the computer 5 ascertains, by way of the analog/digital-converter 12 or 15, values of the active output energy in the form of subordinate quantities, and it can then compare these with the values, obtained by analog multiplication, of the main quantity active energy.

If the difference between the two calculated values of the active energy is too great, the arrangement is either defective or fraud has been attempted.

If the subordinate values require the value of only the voltage $u_N$ or only the current $i_N$, then one of the two analog/digital-converters 12 or 15 is superfluous and it can be dispensed with, together with the associated control circuit 8 or 11. In this case, the input circuit now has only two outputs and the interface circuit 4 now has only two inputs.

In all cases, both electric input quantities voltage $u_N$ and current $i_N$, are supplied to respective inputs of the multiplier 10, the output of which is connected to the computer 5 for the purposes of calculating at least the main quantity active energy by way of the signal/frequency-converter 13. At least one of the two electric input quantities of the arrangement or the output of the multiplier 10 is supplied to the computer 5 for the purpose of determining at least one subordinate quantity by way of an associated analog/digital-converter 12 or 15. If this input quantity is the current $i_N$, then it is supplied to the computer 5 by way of the current/voltage-converter 11 and the associated analog/digital-converter 12 or 15. In a preferred embodiment which is shown in FIG. 1, the values which are supplied to the computer 5 are respectively the current $i_N$ by way of the current/voltage-converter 11 and then the second analog/digital-converter 15, and the voltage $u_N$ by way of the optional voltage sensor 8 and then the first analog/digital-converter 12.

The digital values which are output in parallel from the input circuit 3 are converted into values in the interface circuit 4, e.g. into time serial values, and these values are then supplied to the computer 5 in a time-serial sequence. The values of the main and subordinate quantities which are ascertained in the computer 5 are supplied, possibly after having been previously adapted, to the other interface circuit 6, to the indicator 7 and are indicated there.

Figure 2:
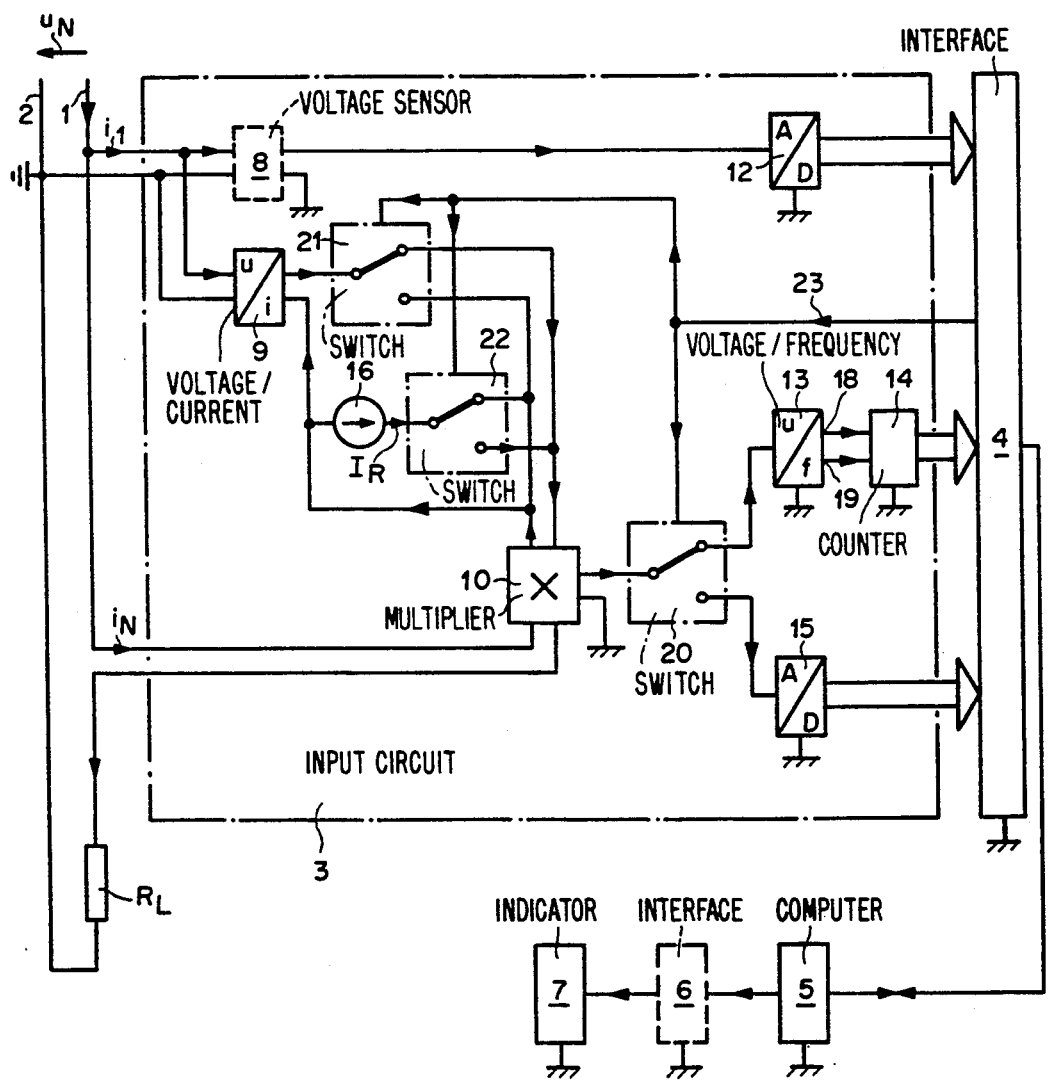
FIG. 2 shows a block circuit diagram of a second variant of the one-phase arrangement.

The second variant, shown in FIG. 2, of the one phase arrangement is of a similar design to the first variant shown in FIG. 1, except that the two multipliers 10 and 17 are replaced by a single multiplier 10, and also there are three selectors 20, 21 and 22 which are controlled in unison by the computer 5 by way of the interface circuit 4. Instead of the three separate single-pole selector switches 20 to 22, shown in FIG. 2, a single three-pole selector switch can be used, three selector contacts of which then form the three selector switches 20 to 22. In FIG. 2, electromechanical selector switches are shown, but in practice electronic semi-conductor selector switches are used.

In the second variant, the current $i_N$ is supplied onto the second input of the multiplier 10, the non-earthed output pole of which is supplied, by means of a first selector switch 20, either to the input of the signal/frequency-converter 13 or to the input of the second analog/digital-converter 15. In the second variant, shown in FIG. 2, there is preferably a voltage/current-converter 9 because the current output thereof can then be treated by the circuitry in a similar manner to the output of the constant current source 16. A first output pole of the voltage/current-converter 9 is in this case connected by means of a second selector switch 21 either to the first or to the second pole of the first input of the multiplier 10, whilst a first pole of the constant current source 16, is connected by means of a third selector switch 22 to that one of the two poles of the first input of the multiplier 10 with which the first output pole of the voltage/current-converter 9 is not connected by the switch 21. The second output pole of the voltage/current-converter 9 and the second pole of the constant current source 16 are connected together, and are also connected to one of the two poles of the first input of the multiplier 10. When the two selector switches 21 and 22 are in the position shown in FIG. 2, the output current of the voltage/current-converter 9 flows from the first output pole thereof by way of the selector switch 21 to the first input of the multiplier 10, whilst the constant current source 16 is short circuited by the third selector switch 22 and is therefore not in operation. On the other hand, when the selector switches 21 and 22 are in the other position, the reference current $I_R$ supplied by the constant current source 16 flows through the third selector switch 22 to the first input of the multiplier 10, whilst the output of the voltage/current-converter 9 is short circuited by the second selector switch 21 and is therefore not operational. The control inputs of the three selector switches 20 to 22 are connected together and are controlled by the control signal 23. The rest of the arrangement shown in FIG. 2 is of the same constructional design as the corresponding part of the arrangement shown in FIG. 1.

The control signal 23 periodically and simultaneously changes over the three selector switches 20 to 22. A periodically alternating voltage then appears at the output of the multiplier 10. The voltage is either proportional to the product $u_N \cdot i_N$ or proportional to the product $I_R \cdot i_N$. Since $I_R$ has a constant value, the value of the latter product is proportional to the value of the current $i_N$ and is supplied to the computer 5 by way of the first selector switch 20, the second analog/digital-converter 15, the third output of the input circuit 3 and the interface circuit 4, for the purpose of ascertaining the subordinate quantities. On the other hand, the values of the first product is proportional to the active output and is supplied to the counter 14 by way of the first selector switch 20 and the signal/frequency-converter 13 for the purpose of ascertaining the main quantity. The counter again ascertains the associated value of the active energy by counting down and up in the way already described, and the value thus ascertained is then fed, by way of the second output of the input circuit 3 and the interface circuit 4, to the computer 5 to be stored and, if necessary, to be processed further. The computer again serves to ascertain the values of main and subordinate quantities. The period during which the switches are switched over from the state in which the main quantities are ascertained to that in which the subordinate quantities are ascertained is short such as 1% to 2% of the total time, which is long enough for the sample/hold circuit of the analog/digital-converter 15 to be able to perform the sampling operation.

Apart from this, the arrangement of the second variant operates in exactly the same way as the first variant. In particular, in an advantageous embodiment of the arrangement, the voltage $u_N$ reaches the computer 5 by way of the optional voltage sensor 8, the first analog-digital-converter 12, the first output of the input circuit 3 and the interface circuit 4, for the purpose of calculating subordinate quantities.

If the subordinate quantities require only values of the voltage $u_N$ or only values of the current $i_N$, then one of the two analog/digital-converters 12 or 15 is again superfluous and, together with its associated control circuit 8 or 16; 20; 21; 22, can be dispensed with. In that case, the input circuit 3 again has only two outputs.

Therefore, it is correct to say that in the second variant the current $i_N$ is always supplied to one of the two inputs of the multiplier 10, the output of which is generally connected to the computer 5 by way of the first selector switch 20 and either by way of the signal-frequency-converter 13 for the purpose of ascertaining at least one main quantity, or by way of the second analog/digital-converter 15 for the purpose of ascertaining at least one subordinate quantity. If the output of the multiplier 10 is connected to the computer 5 by way of the signal-frequency-converter 13, the other one of the two inputs of the multiplier 10 is fed with the voltage $u_N$ by way of the voltage/current-converter 9 and the second selector switch 21. However, if the output of the multiplier 10 is connected to the computer 5 by way of the second analog/digital-converter 15, the other one of the two inputs of the multiplier 10 is supplied by the constant reference current $I_R$ of the constant current source 16 by way of the third selector switch 22.

Figure 3:
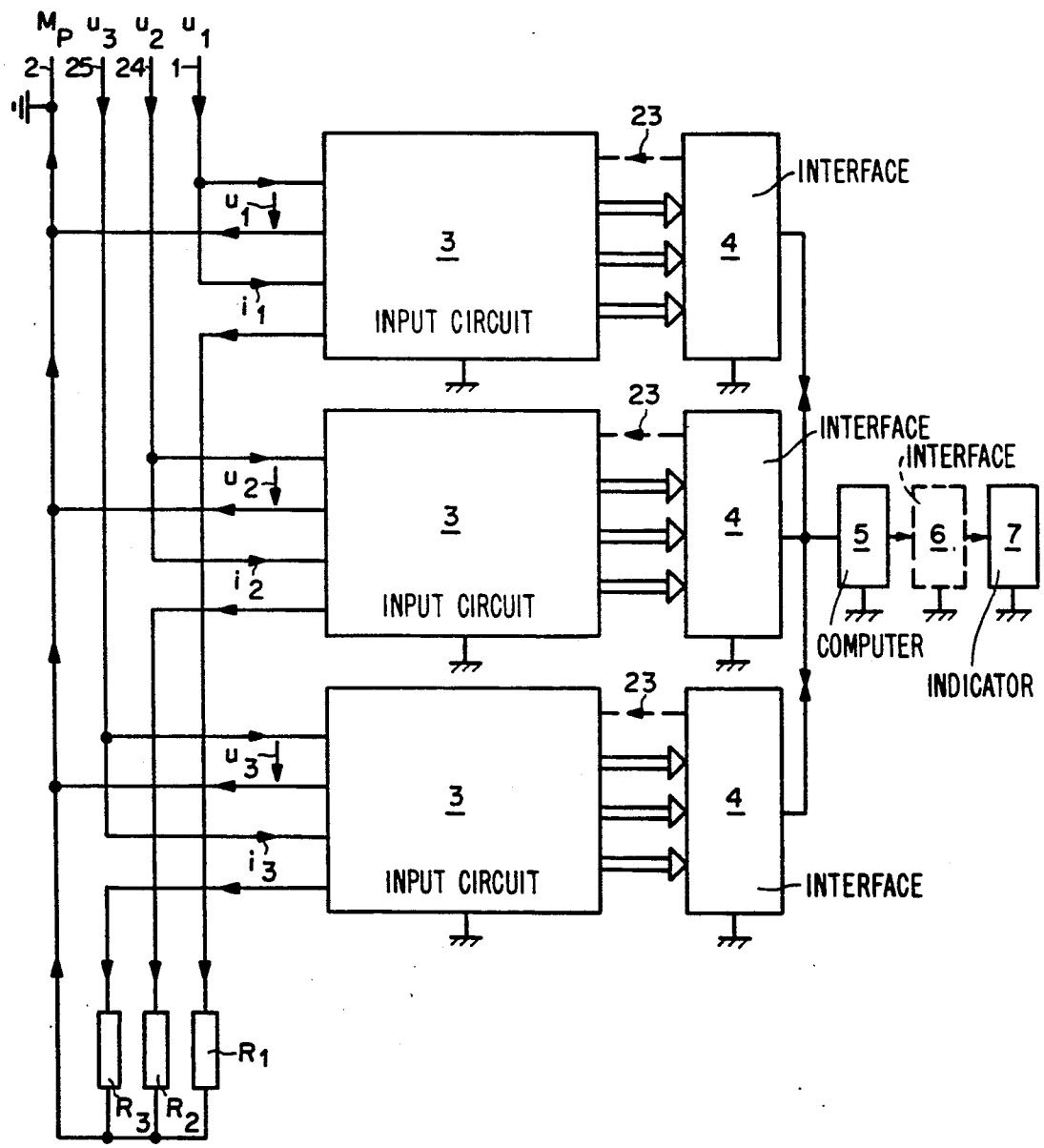
FIG. 3 shows a block circuit diagram of a three phase arrangement.

The three phase arrangement shown in FIG. 3 is supplied by way of four conductors 1, 2, 24 and 25 by three voltages $u_1$, $u_2$ and $u_3$ of a three phase energy supply network. The conductor 2 is a neutral conductor and the three conductors 1, 24 and 25 are phase conductors. Therefore, the three voltages $u_1$, $u_2$ and $u_3$ are preferably the phase voltages of the three phase energy supply network. The conductor 2 then lies at the common reference potential $M_p$ of the three voltages $u_1$, $u_2$ and $u_3$, and is usually earthed.

With each of the three voltages $u_1$, $u_2$ and $u_3$ there is associated an input circuit 3 and an interface circuit 4, which are both connected in cascade in the sequence disclosed, and which are of the same design internally as those of the one phase arrangement (see FIG. 1 and FIG. 2). The input circuits 3 thus each have, as before, two input quantities, namely one of the voltages $u_1$, $u_2$ or $u_3$ which is the first input quantity, and the current $i_1$, $i_2$ or $i_3$ which is associated with that voltage and which forms the second input quantity. As before, the voltages $u_1$, $u_2$ and $u_3$ supply, in bipolar fashion, a first input, and the currents $i_1$, $i_2$ and $i_3$ supply, again in bipolar fashion, a second input of the associated input curcuit 3. The first inputs of the input circuits 3 are simultaneously supply inputs of the three phase arrangement.

Each current $i_1$, $i_2$ and $i_3$ of the three-phase arrangement flows into the associated input circuit 3 at a first pole of the second input thereof, passes through that input circuit and then leaves it again at a second pole of the second input, so as then to pass through a respective phase load which is shown symbolically in FIG. 3 by one of the three load-resistors $R_1$, $R_2$ or $R_3$, the common star point of which is connected to the conductor 2. In FIG. 3 it is still to be assumed that each input circuit 3 has three outputs which are each connected, by way of a bus connector, to their associated interface circuit 4. All interface circuits 4 are connected in turn, to a common cascade of circuits 5; 6; 7, which in the sequence disclosed consists of the computer 5, the optional other interface circuit 6 and the indicator When the input circuits 3 are in the configuration shown in FIG. 2, each interface circuit 4 also has an additional output which is connected to another input of the associated input circuit 3, wherein by way of this connection, which is shown by broken lines in FIG. 3, the control signal 23 coming from the computer 5 is transmitted from the interface circuit 4 to the associated input circuit 3. All input circuits 3 may, for example, therefore be controlled by the same control signal 23.

The mode of operation of the three phase arrangement is the same as that of the corresponding one phase arrangement apart from the fact that three times as many quantities are to be ascertained, evaluated, stored and indicated.

In all variants, the currents $i_N$ or $i_1$, $i_2$ and $i_3$ can also be supplied to the multiplier 10 and/or the current/voltage-converter 11 by way of a current converter, or shunt resistor, not shown.

In all variants, the multipliers 10 and 17, and thus also the current/voltage-converter 11, preferably each contain a Hall element which is exposed to the magnetic field produced by the current $i_N$ and to the induction $B_N$ thereof.

Figure 4:
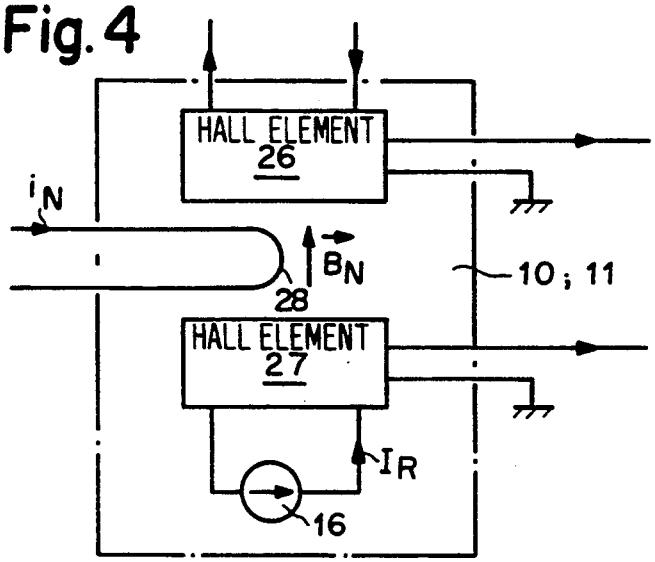
FIG. 4 shows a block circuit diagram of a combination, equipped with Hall elements, of a multiplier and of a current/voltage-converter.
Figure 5:
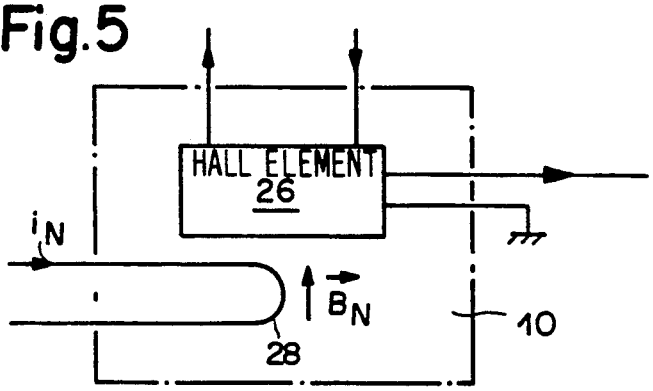
FIG. 5 shows a block circuit diagram of a multiplier equipped with a Hall element.

The combination 10; 11 of the first variant (see FIG. 1) which consists of the multiplier 10 and the current-/voltage-converter 11 containing the multiplier 17 is then of the design shown in FIG. 4, whereas the multiplier 10 of the second variant (see FIG. 2) is then of the design shown in FIG. 5.

In both the variants (see FIG. 4 and FIG. 5), the current input of a first Hall element 26 respectively forms the first input of the multiplier 10, whilst the Hall voltage at the output of the first Hall element 26 corresponds to the output signal of the multiplier 10 in all cases. The current input of the first Hall element 26 is always supplied by the voltage $u_N$ by way of the voltage/current-converter 9. In the combination 10; 11 shown in FIG. 4, the current input of a second Hall element 27 is supplied by the constant reference current $I_R$ of the constant current source 16, whilst the Hall voltage of the second Hall element 27 corresponds to the output signal of the current/voltage-coverter 11. The current $i_N$ preferably flows through a U-shaped current loop 28 to produce the induction $B_N$. Both the Hall elements 26 and 27 are then exposed to this induction $B_N$, e.g. when they are disposed in an air gap of a common ferromagnetic core, in the inside of which the induction $B_N$ is produced by means of the current loop 28 in which the current $i_N$ flows.

The multiplier 10 of the second variant shown in FIG. 5 differs from the combination 10; 11 shown in FIG. 4 only in that the second Hall element 27 and the constant current source 16 are omitted.

Figure 6:
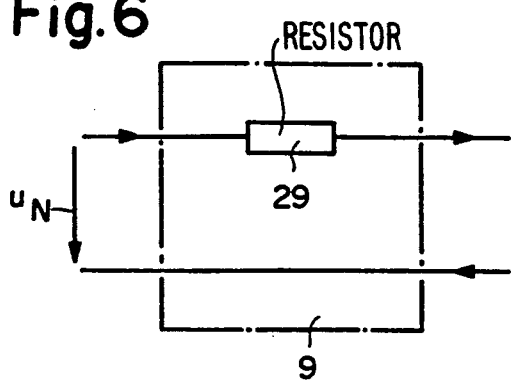
FIG. 6 shows a circuit diagram of a voltage/current converter.

The voltage/current-converter 9 is preferably a series resistor 29 and is then of the design shown in FIG. 6. Inside the voltage/current-converter 9, a first input pole thereof is connected, by way of the series resistor 29 to a first output pole, and the second output pole thereof is directly connected to a second respective output pole of the voltage/current-converter 9.

It will be appreciated that many modifications and developments may be made to the embodiments of the invention described above without departing from the scope or spirit of the invention.

What is claimed is:

1. An electricity consumption measuring arrangement for determining at least two output electrical quantities from the same two input electrical quantities, wherein the output electrical quantities to be determined include at least a main quantity which is an active energy that is determined with a high accuracy and high security against fraud and a subordinate quantity that is determined with a lower accuracy and a lower security against fraud, and wherein said arrangement comprises first input means for receiving a first of said input electrical quantities in the form of a voltage, second input means for receiving a second of said input electrical quantities in the form of a current associated with the voltage, a single common digital computing means for outputting both said main quantity with a high accuracy and high security against fraud and said subordinate quantity with a lower accuracy and lower security against fraud, low security circuit means including a first analog-to-digital converter for transmitting a signal representative of one of said first or second input electrical quantities at said first or second input means, respectively, to said common computing means to determine said subordinate quantity with a lower accuracy and lower security against fraud, a first multiplier for multiplying said first and second input electrical quantities to form an output signal representative of the product of said first and second input electrical quantities, and high security circuit means including a signal-to-frequency converter for receiving said output signal of said multiplier and for transmitting a signal representative of said output signal of said multiplier for enabling said common computing means to determine said main quantity with a high accuracy and high security against fraud.

2. The arrangement of claim 1 wherein said output signal of said first multiplier is connected via said first analog-to-digital converter or via a second analog-to-digital converter to said computing means in order to determine a subordinate quantity.

3. The arrangement of claim 1 wherein a signal representative of said current associated with said voltage is transmitted to said computing means via a current-to-voltage converter and an analog-to-digital converter located downstream of the current-to-voltage converter.

4. The arrangement of claim 3 wherein said current-to-voltage converter is a second multiplier comprising a Hall element subjected to a magnetic field produced by said current associated with said voltage, said Hall element having a current input for receiving a constant reference current.

5. The arrangement of claim 3 wherein said current-to-voltage converter comprises a second multiplier having a first input for receiving said current associated with said voltage and a second input for receiving a constant reference current.

6. The arrangement of claim 5 wherein said second multiplier of said current-to-voltage converter comprises a Hall element which is subjected to a magnetic field produced by said current associated with said voltage and which has a current input for receiving said constant reference current.

7. The arrangement of claim 1 wherein said voltage is transmitted to said computing means via an analog-to-digital converter.

8. The arrangement of claim 1 wherein said first multiplier comprises a Hall element which is subjected to a magnetic field produced by said current associated with said voltage and which has a current input which is supplied via a voltage-to-current converter with said voltage.

9. The arrangement of claim 8 wherein said voltage-to-current converter comprises a resistor.

10. The arrangement of claim 1 wherein said computing means comprises a microcomputer.

11. The arrangement of claim 1 wherein said subordinate quantity is said voltage.

12. The arrangement of claim 1 wherein said subordinate quantity is the current associated with said voltage.

13. The arrangement of claim 1 wherein said subordinate quantity is volt-hours.

14. The arrangement of claim 1 wherein said subordinate quantity is volt-square-hours.

15. The arrangement of claim 1 wherein said subordinate quantity is current-square hours.

16. The arrangement of claim 1 wherein said subordinate quantity is reactive power.

17. The arrangement of claim 1 wherein said subordinate quantity is reactive energy.

18. The arrangement of claim 1 wherein said subordinate quantity is apparent power.

19. The arrangement of claim 1 wherein said subordinate quantity is apparent energy.

20. The arrangement of claim 1 wherein said subordinate quantity is a power factor.

21. An arrangement for determining output electrical quantities from at least two input electrical quantities, wherein the output electrical quantities to be determined include at least one main quantity which is an active energy and one subordinate quantity, and wherein said arrangement comprises first input means for receiving a first of said input electrical quantities in the form of a voltage, second input means for receiving a second of said input electrical quantities in form of a current associated with the voltage, computing means, means including a first analog-to-digital converter for transmitting a signal representative of one of said first or second input electrical quantities at said first or second input means, respectively, to said computing means to determine said subordinate quantity, a first multiplier for multiplying said first and second input electrical quantities to form an output signal representative of the product of said first and second input electrical quantities, and means including a signal-to-frequency converter for receiving said output signal of said multiplier and for transmitting a signal representative of said output signal of said multiplier to said computing means to determine said main quantity, wherein the precision and security of said main quantity is greater than the precision and security of said subordinate quantity, wherein the output signal of said first multiplier is transmitted by means of a first selector switch to either said signal-to-frequency converter to determine said main output electrical quantity or to an analog-to-digital converter to determine a subordinate output electrical quantity, whereby when said output signal is transmitted to said signal-to-frequency converter said first multiplier receives a signal representative of said voltage via a second selector switch and when said output signal is transmitted to an analog-to-digital converter said first multiplier receives a fixed reference current via a third selector switch.

22. A multifunction electrical meter arrangement for determining a main output quantity which is active energy with a high security against fraud and a subordinate quantity with a lower security against fraud, said arrangement comprising a first input for receiving a current, a second input for receiving a voltage, a low security circuit including an analog-to-digital converter for outputting a low security signal representative of said current or voltage, a multiplier for multiplying said current and voltage and for outputting a signal representative of the product of said current and voltage, a high security circuit including a signal-to-frequency converter for outputting a high security signal representative of the output signal of said multiplier, and a common digital computer for utilizing the high security signal and the low security signal to output said main quantity with a high security against fraud and said subordinate quantity with a lower security against fraud.

* * * * *